(12) United States Patent
Maa et al.

(10) Patent No.: US 6,458,514 B1
(45) Date of Patent: Oct. 1, 2002

(54) PROCESS FOR FORMING THROUGH HOLES IN SUBSTRATE OF PRINTED CIRCUIT BOARD

(76) Inventors: Chong-Ren Maa, 10F-3, No. 458, Kuang Fu South Rd., Taipei (TW); Hong-Ming Lin, No. 31, Alley 2, Lane 221, Kao Tsui Rd., Hsinchu City (TW); Toshikazu Oda, Miyatani 94-31, Hirono-Cho, Uji-Shi, Kyoto-Fu (JP); Makoto Nakamura, Yatsu 2-5-22, Narasino-Shi, Chiba-Ken (JP); Sunao Meguro, Kizuki 545-2, Nakahara-Ku, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 09/588,593

(22) Filed: Jun. 7, 2000

(51) Int. Cl.⁷ .................................................. G03F 7/00
(52) U.S. Cl. ..................... 430/313; 430/318; 430/945; 216/18
(58) Field of Search .............................. 430/313, 318, 430/945; 216/18

(56) References Cited

U.S. PATENT DOCUMENTS

| | | | | |
|---|---|---|---|---|
| 5,891,606 A | * | 4/1999 | Brown | 430/312 |
| 5,979,044 A | * | 11/1999 | Sumi et al. | 29/830 |
| 5,998,237 A | * | 12/1999 | Conrod et al. | 438/106 |
| 6,015,520 A | * | 1/2000 | Appelt et al. | 264/104 |
| 6,214,525 B1 | * | 4/2000 | Boyko et al. | 430/313 |
| 6,110,650 A | * | 8/2000 | Bhatt et al. | 430/313 |
| 6,165,892 A | * | 12/2000 | Chazan et al. | 438/623 |
| 6,225,028 B1 | * | 5/2001 | Bhatt et al. | 430/311 |

* cited by examiner

Primary Examiner—Janet Baxter
Assistant Examiner—Amanda C. Walke
(74) Attorney, Agent, or Firm—Browdy and Neimark, P.L.L.C.

(57) ABSTRACT

One or more through holes are formed by a process in a printed circuit board substrate formed of a resinous dielectric sheet and a conductive layer covering one surface of the dielectric sheet. The process involves the forming by laser one or more cavities on other surface of the dielectric sheet such that the cavities penetrate only the dielectric sheet, without penetrating the conductive layer. Both surfaces of the dielectric sheet are coated with a liquid photoresist layer such that the cavities are filled with the photoresist. A plurality of small areas are formed by photolithography on the surface which is covered with the conductive layer. The small areas are corresponding in location and shape to the cavities which may be of any shape. The small areas are stripped of the conductive, layer by etching before the cavities are stripped of the photoresist. The through holes are thus formed in the small areas defined by the cavities.

4 Claims, 3 Drawing Sheets

PROCESS FOR FORMING THROUGH HOLES IN SUBSTRATE OF PRINTED CIRCUIT BOARD

FIELD OF THE INVENTION

The present invention relates generally to a preparation for making a printed circuit board, and more particularly to a substrate of the printed circuit board.

BACKGROUND OF THE INVENTION

The conventional method for making a printed circuit board involves the forming of through holes by a punch press or drilling machine prior to the formation of circuit pattern. The through holes are intended for use in connecting the components or circuits of adjoining layers of the printed circuit board by the bonding wires which are put through the through holes. The preformation of the through holes often results in the high rejection rate of the printed circuit board so made. For example, the formation of circuit pattern is adversely affected in view of the rugged surface which is formed on the substrate. In other word, it is technically difficult to planarize the rugged surface which is covered with a dry film photoresist. The technical problem persists even if a liquid photoresist is used in place of the dry film photoresist. In order to prevent the leak of the liquid photoresist via the through holes of the substrate, it is necessary to clog temporarily the through holes before the liquid photoresist is applied on the substrate. Upon completion of formation of circuit pattern on the substrate, the through holes are unclogged. The process of unclogging the through holes is rather time-consuming.

SUMMARY OF THE INVENTION

It is the primary objective of the present invention to provide a cost-effective process for forming through holes in a printed circuit board substrate.

It is another objective of the present invention to provide a through-hole forming process enabling a circuit pattern of high density to be formed on a printed circuit board substrate.

It is still another objective of the present invention to provide a through-hole forming process which can be carried out along with a process for forming a circuit pattern.

In keeping with the principle of the present invention, the foregoing objectives of the present invention are attained by the process involving the use of a substrate which comprises a resinous dielectric sheet and a conductive layer adhered to a first surface of the resinous dielectric sheet. A plurality of cavities are formed by laser on a second surface of the dielectric sheet such that the cavities penetrate the dielectric sheet, without penetrating the conductive layer. Thereafter, the substrate is coated on both surfaces thereof with a liquid photoresist of a predetermined thickness. The cavities are filled with the liquid photoresist. A plurality of small areas are formed by photolithography on the surface which is covered with the conductive layer. The small areas correspond in shape and location to the cavities. The conductive layer of the small areas is removed by etching before the cavities are stripped of the photoresist. The through holes are thus formed on the small areas defined by the cavities, which may be of any shape.

According to the present invention, the photoresist coating, the photolithography, and the etching are carried our along with forming a circuit pattern on the PLB substrate.

DETAILED DESCRIPTION OF THE INVENTION

Figure 1:
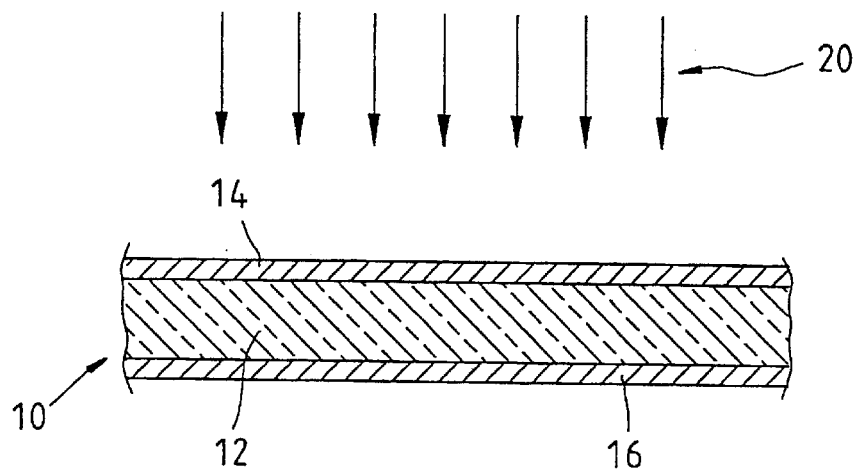
FIG. 1 shows a sectional view of a printed circuit board substrate of the present invention.

As shown in all drawings provided herewith, the present invention involves the use of a printed circuit board substrate 10 which comprises a dielectric sheet 12 and two conductive layers 14 and 16. The dielectric sheet 12 is made of a mixture of epoxy resin and glass fiber. The conductive layers 14 and 16 are formed of copper foil and are attached respectively to two opposite surfaces of the substrate 10. The substrate 10 has an upper surface 102 and a lower surface 104 opposite to the upper surface 102.

Figure 2:
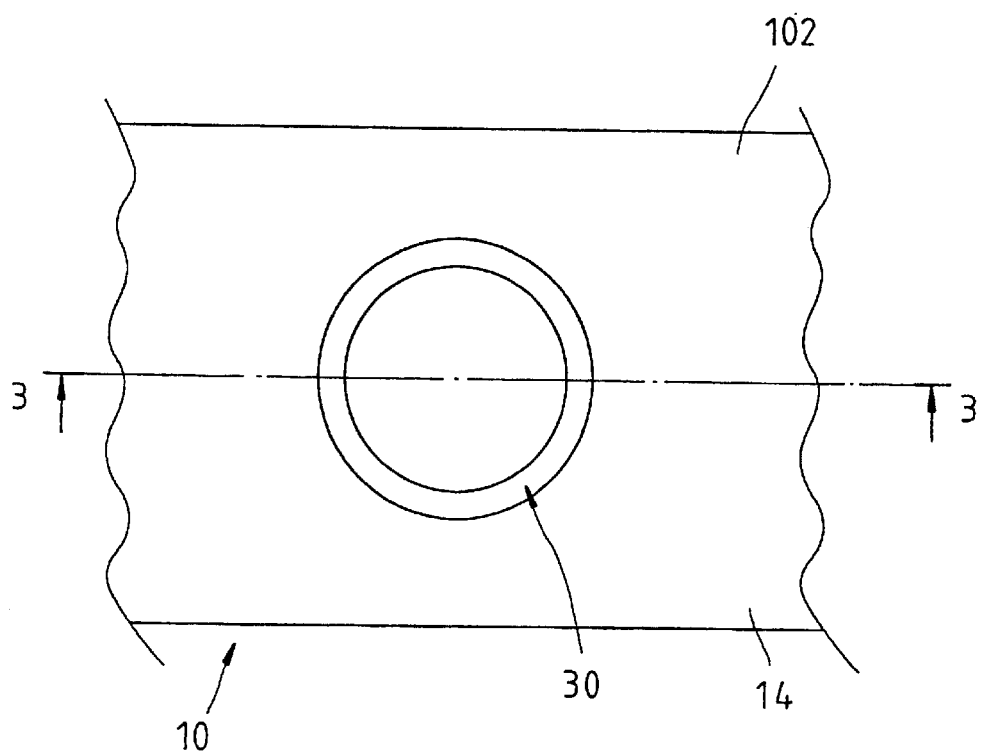
FIG. 2 is a top view showing the formation of an annular cavity on one surface of the substrate as shown in FIG. 1.
Figure 3:
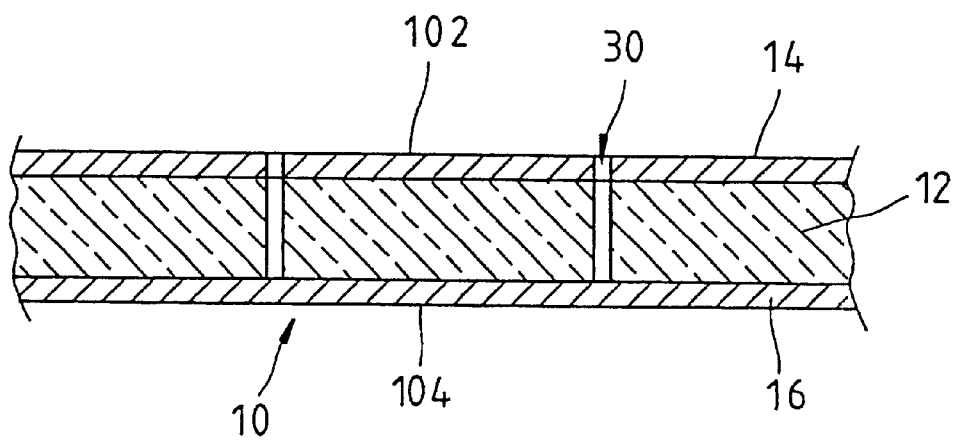
FIG. 3 shows a sectional view taken along the direction indicated by a line 3—3 as shown in FIG. 2.

The substrate 10 is provided in the upper surface 102 with one or more cavities 30 of a predetermined shape by laser. The cavities 30 have a depth extending from the upper conductive layer 14 to the dielectric sheet 12, without penetrating the lower conductive layer 16, as shown in FIGS. 2 and 3.

Figure 4:
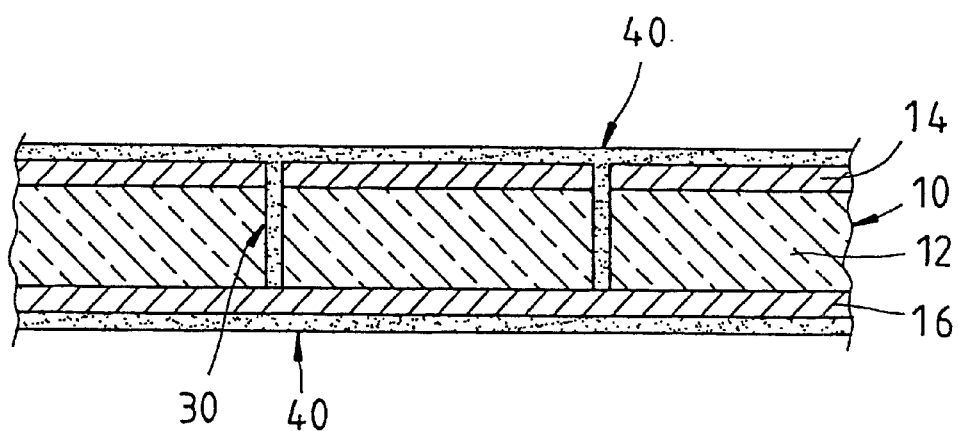
FIG. 4 shows a sectional view of the substrate with two opposite surfaces thereof being coated with a liquid photoresist.
Figure 5:
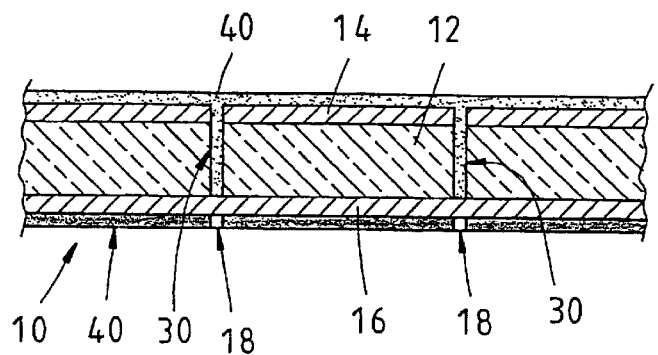
FIG. 5 shows formation of an annular portion on other surface of the substrate by photolithography such that the annular portion corresponds in location to the cavity.

The upper surface 102 and the lower surface 104 of the substrate 10 are coated by a mechanical means with a liquid photoresist layer 40. The liquid photoresist is allowed to flow into the cavities 30 from the upper surface 102, as shown in FIG. 4. The substrate 10 is dried by baking and is then provided with a circuit pattern by the conventional technique. The substrate 10 is provided by photolithography in other surface thereof with one or more small areas 18 corresponding in shape and location to the cavities 30, as shown in FIG. 5.

Figure 6:
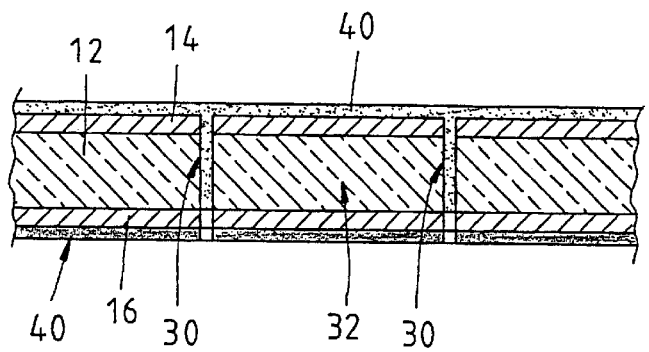
FIG. 6 shows a sectional view of the annular portion which is stripped of the conductive layer.
Figure 7:
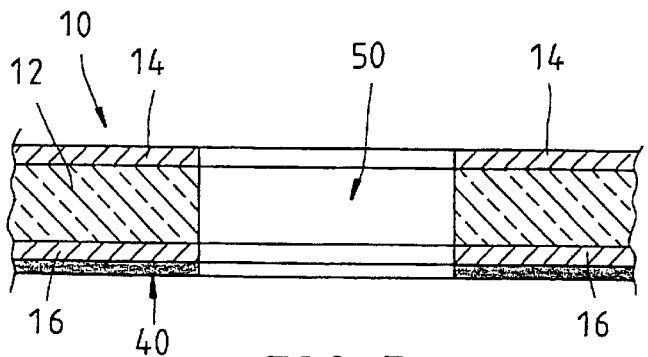
FIG. 7 shows a sectional view of the formation of a through hole in the substrate as a result of the cavity being stripped of the photoresist.

As illustrated in FIG. 6, the conductive layer of the substrate 10 has small areas corresponding to the small areas 18. The small areas of the conductive layer are etched. Finally, the cavities 30 are stripped of the photoresist. As columnar portions 32 of the cavities 30 are removed, a plurality of through holes 50 are formed, as shown in FIG. 7.

What is claimed is:

1. A process for forming one or more through holes in a printed circuit board (PCB) substrate formed of a resinous dielectric sheet and a conductive layer covering a first surface of the dielectric sheet, said process comprising the steps of:

(a) forming by laser one or more annular cavities on a second surface of the PCB substrate such that the cavities penetrate only the dielectric sheet;

(b) coating the first surface and the second surface of the substrate with a liquid photoresist layer such that the cavities are filled with the liquid photoresist;

(c) forming by photolithography one or more small areas on the first surface covered by the conductive layer such that the small areas correspond in location and shape to the cavities;

(d) removing by etching the conductive layer covering the small areas formed in the step (c); and (e) stripping the cavities of the photoresist to form through holes in the small areas which are defined by the cavities.

2. The process as defined in claim 1, wherein the photoresist coating, the photolithography, and the etching are carried out along with the forming of a circuit pattern on the PCB substrate.

3. A process for forming one or more through holes in a printed circuit board (PCB) substrate formed of a resinous dielectric sheet and two copper layers covering respectively an upper surface of the dielectric sheet and a lower surface of the dielectric sheet, said process comprising the steps of:

(a) forming by laser one or more annular cavities on the upper surface of the dielectric sheet such that the cavities penetrate the upper copper layer and the dielectric sheet, without penetrating the lower copper layer covering the lower surface of the dielectric sheet;

(b) coating the upper surface and the lower surface of the PCB substrate with a liquid photoresist layer such that the cavities are filled with the liquid photoresist;

(c) forming by photolithography one or more small areas on the lower surface such that the lower copper layer exhibits the small areas corresponding in location and shape: to the cavities;

(d) removing by etching the lower copper layer covering the small areas formed in the step (c); and (e) stripping the cavities of the photoresist to form through holes in the small areas which are defined by the cavities.

4. The process as defined in claim 3, wherein the photoresist coating, the photolithography, and the etching are carried out along with the forming of a circuit pattern on the PCB substrate.

* * * * *